United States Patent
Joblot et al.

(10) Patent No.: US 9,673,088 B2
(45) Date of Patent: Jun. 6, 2017

(54) PROCESS FOR FABRICATING AN INTEGRATED CIRCUIT COMPRISING AT LEAST ONE COPLANAR WAVEGUIDE

(71) Applicant: STMicroelectronics SA, Montrouge (FR)

(72) Inventors: Sylvain Joblot, Bizonnes (FR); Pierre Bar, Grenoble (FR)

(73) Assignee: STMicroelectronics SA, Montrouge (FR)

(*) Notice: Subject to any disclaimer, the term of this patent is extended or adjusted under 35 U.S.C. 154(b) by 0 days.

(21) Appl. No.: 14/970,792

(22) Filed: Dec. 16, 2015

(65) Prior Publication Data
US 2016/0097898 A1   Apr. 7, 2016

Related U.S. Application Data

(62) Division of application No. 13/483,162, filed on May 30, 2012, now Pat. No. 9,240,624.

(30) Foreign Application Priority Data

Jun. 1, 2011   (FR) ..................... 11 54824

(51) Int. Cl.
*H01L 21/768* (2006.01)
*G02B 6/12* (2006.01)
(Continued)

(52) U.S. Cl.
CPC .......... *H01L 21/76831* (2013.01); *G02B 6/12* (2013.01); *H01L 21/4846* (2013.01);
(Continued)

(58) Field of Classification Search
CPC ................ G02B 6/12; H01L 21/76224; H01L 21/76831; H01L 21/76898; H01P 11/003
See application file for complete search history.

(56) References Cited

U.S. PATENT DOCUMENTS 5,654,220 A * 8/1997 Leedy ................. G03F 7/70658
257/E21.545
5,990,768 A    11/1999 Takahashi et al.
(Continued)

FOREIGN PATENT DOCUMENTS

EP         2284888 A2    2/2011

OTHER PUBLICATIONS

INPI Search Report and Written Opinion for FR 1154824 mailed Jan. 18, 2012 (9 pages).
(Continued)

*Primary Examiner* — Daniel Petkovsek
(74) *Attorney, Agent, or Firm* — Gardere Wynne Sewell LLP

(57) ABSTRACT

An integrated circuit includes a silicon-on-insulator wafer and interconnect layer providing a support for a coplanar waveguide formed above a top side of the support. A through-silicon via is formed from a back side of the support and passing through the silicon-on-insulator wafer to reach the interconnect layer. A trench is formed from the back side of the support underneath the coplanar waveguide. The trench extends over at least an entire length of the coplanar waveguide. The trench passes through the silicon-on-insulator wafer to reach the interconnect layer and may have a substantially same depth as the through-silicon via.

17 Claims, 5 Drawing Sheets

(51) Int. Cl.
*H01P 11/00* (2006.01)
*H01L 21/762* (2006.01)
*H01L 21/48* (2006.01)

(52) U.S. Cl.
CPC .. *H01L 21/76224* (2013.01); *H01L 21/76898* (2013.01); *H01P 11/003* (2013.01)

(56) References Cited

U.S. PATENT DOCUMENTS

| | | | |
|---|---|---|---|
| 8,767,299 B2* | 7/2014 | Liu | G02B 5/1857 |
| | | | 359/566 |
| 9,240,624 B2* | 1/2016 | Joblot | H01L 21/76898 |
| 2005/0237137 A1 | 10/2005 | Dutta | |
| 2008/0044979 A1 | 2/2008 | Wells et al. | |
| 2008/0048196 A1 | 2/2008 | Strittmatter et al. | |
| 2009/0087137 A1* | 4/2009 | Doan | B82Y 20/00 |
| | | | 385/14 |
| 2010/0032764 A1 | 2/2010 | Andry et al. | |
| 2011/0267152 A1 | 11/2011 | Lee | |
| 2013/0075904 A1* | 3/2013 | Cho | H01P 1/047 |
| | | | 257/738 |
| 2013/0313724 A1 | 11/2013 | Joblot et al. | |

OTHER PUBLICATIONS

Sanming Hu et al: "TSV Technology for Millimeter-Wave and Terahertz Design and Applications," IEEE Transactions on Components, Packaging and Manufacturing Technology, IEEE, USA, vol. 1, No. 2, Feb. 1, 2011, pp. 260-267.

* cited by examiner

PROCESS FOR FABRICATING AN INTEGRATED CIRCUIT COMPRISING AT LEAST ONE COPLANAR WAVEGUIDE

CROSS-REFERENCE TO RELATED APPLICATIONS

This application is a divisional application from U.S. patent application Ser. No. 13/483,162 filed May 30, 2012, which claims priority from French Application for Patent No. 1154824 filed Jun. 1, 2011, the disclosures of which are hereby incorporated by reference.

TECHNICAL FIELD

The invention relates to integrated circuits, and more particularly to integrated circuits comprising high-frequency components such as coplanar waveguides.

BACKGROUND

Coplanar waveguides (CPW) generally comprise a conductive line placed between two ground lines, and allow components such as antennas operating at frequencies of, for example, about several tens of gigahertz, to be electrically connected. When a high-frequency signal is passed through such a waveguide, losses can lead to the signal being attenuated. These losses are in particular due to the resistance and inductance of the line, to capacitive coupling to the substrate, and to conductance allowing ground return.

In order to reduce these losses, it has been suggested, by Gamble, "Low-loss CPW lines on surface stabilized high-resistivity silicon," IEEE Microwave and Guided Wave Letters, Vol. 9, No. 10, October 1999, that these coplanar waveguides be fabricated using metal lines on high-resistivity silicon substrates. Thus low conductance is obtained between the conductive line and the ground lines. The diffusion of metals, for example gold or copper, into the silicon, and the possibility that charge trapped in a passivation layer placed in contact with the conductive lines will induce a conductive channel in the substrate, between the signal and ground, are the drawbacks of this solution.

Superposing the conductive lines of the coplanar waveguides on insulating lines, for example silicon-dioxide ($SiO_2$) lines, on a high-resistivity silicon substrate has also been suggested. This solution has the drawback of forming capacitive coupling between the conductive lines and the substrate. Moreover, charge trapped in a passivation layer, placed in contact with the conductive lines, can also induce a conductive channel in the high-resistivity silicon substrate, between the regions under the conductive lines.

It has also been suggested that the conductive lines of the coplanar waveguides be formed on an insulating layer, placed on a polycrystalline-silicon layer, itself placed on a high-resistivity silicon substrate. This solution allows current flowing under the insulating layer to be captured in the polycrystalline-silicon layer.

The reader may also refer to Ojefors, "Micromachined loop antennas on low resistivity silicon," IEEE Transactions on Antennas and Propagation, 2006, Vol. 54, No. 12, pages 3593-3601, describing the formation of trenches in the silicon substrate under the oxide layer and located substantially between the conductive lines of an antenna and a ground plane. This solution in particular has the drawback of being complicated to implement.

Finally, Wojnowski, "Package Trends for Today's and Future mm-Wave Applications," Infineon, 38th European Microwave Conference, 2008, describes the formation of a cavity matrix under the coplanar waveguides. This solution does not sufficiently limit losses, in particular because of parasitic conductivity in the silicon. The formation of the cavities described in this document also has the drawback of being implemented before metal lines have been formed on the frontside of the integrated circuits.

Moreover, it may be necessary to use through-silicon vias in integrated circuits, for example in order to form three-dimensional stacks or in order to form electrical contacts on a side opposed to that comprising the metal lines of the integrated circuit.

SUMMARY

According to one method of implementation and embodiment, coplanar-waveguide loss is reduced while compatibility is maintained with the process for fabricating through-silicon vias.

According to one aspect, a process is provided for fabricating an integrated circuit in and/or on a semiconductor support, the process comprising producing at least one through-silicon via through the semiconductor support, and at least one coplanar waveguide above the semiconductor support.

Production of said at least one through-via comprises producing at least one through-cavity through the semiconductor support, and the process furthermore comprises, after the waveguide has been produced, forming a continuous or discontinuous trench under the waveguide, extending over at least the entire length of the waveguide, said at least one cavity and said at least one trench being produced simultaneously and having substantially the same depth.

The semiconductor support may comprise a bulk silicon substrate.

In a variant, the semiconductor support may comprise a top layer comprising silicon regions and isolating regions (for example STI trenches), said layer being supported by an insulating layer itself supported by a silicon substrate. In other words, the semiconductor support is an SOI (silicon-on-insulator) wafer.

Thus, by forming at least one trench under the waveguide, charge present at the interface between the buried oxide (if an SOI wafer is used) and the substrate cannot flow and losses are thus limited. The use of an SOI substrate also allows these losses to be reduced. The simultaneous production of loss-reducing trenches and cavities allowing through-silicon vias to be produced is particularly advantageous and simplifies fabrication of the integrated circuit. This is because the through-silicon vias (TSVs) are used to connect the integrated circuit and possibly three-dimensional integrated-circuit stacks, and producing the orifices simultaneously, after the waveguide has been produced, simplifies fabrication of the integrated circuit.

Moreover, since the same etching operation is used to form the cavities and the trenches, the depth of a through-silicon-via cavity is profitably used to obtain trenches having a high aspect ratio, in order to better limit losses.

Although a continuous trench can be produced, it is advantageous to form a discontinuous trench extending over at least the entire length of the waveguide, especially for reasons of stiffness.

The discontinuous trench comprises interruptions of the trench, for example placed at regular intervals. These interruptions can be sufficiently short that conduction in the silicon substrate does not increase losses, for example they may be chosen so that their length is negligible relative to the total length of the trench. Thus the stiffness of the integrated circuit is increased. Increasing the stiffness of the integrated circuit allows the process to be implemented more easily.

Advantageously, the process furthermore comprises filling said at least one cavity and said at least one trench with a polymer.

This polymer therefore fills the through-orifices of the through-silicon vias, and the trenches located under the waveguides. Moreover, an aspect ratio may be chosen in order to make the filling with a polymer easier.

The silicon substrate may be a high-resistivity silicon substrate.

Advantageously, production of the coplanar waveguide comprises producing an electrically conductive line on the semiconductor support, the line being placed between two ground lines and a set of two trenches substantially between the ground lines and said electrically conductive line.

Current flow under the buried oxide of the wafer, between regions located under the electrically conductive line and the ground lines, is thus limited. The various lines that form the waveguides are thus isolated from one another.

According to another aspect, an integrated circuit is provided, comprising, on a semiconductor support, at least one coplanar waveguide, at least one through-silicon via opening onto the side of the support opposed to that supporting the coplanar waveguide and passing through the semiconductor support, the insulating layer and the top layer, and at least one trench placed under the waveguide extending over at least the entire length of the waveguide and having substantially the same depth as said through-silicon via.

Said at least one trench may be discontinuous.

The semiconductor support may comprise a bulk silicon substrate.

The semiconductor support may comprise a top layer comprising silicon regions and isolating regions, the layer being supported by an insulating layer itself supported by a silicon substrate.

Advantageously, each through-via and each trench comprises a polymer.

Furthermore, the substrate may be a high-resistivity silicon substrate.

Said coplanar waveguide may comprise an electrically conductive line placed between two ground lines and the integrated circuit comprises two trenches placed substantially between the ground lines and said electrically conductive line.

BRIEF DESCRIPTION OF THE DRAWINGS

Other advantages and features of the invention will become clear on studying the detailed description of methods of implementation and embodiment, given by way of non-limiting example, and illustrated by the annexed drawings in which.

DETAILED DESCRIPTION OF THE DRAWINGS

Figure 1:
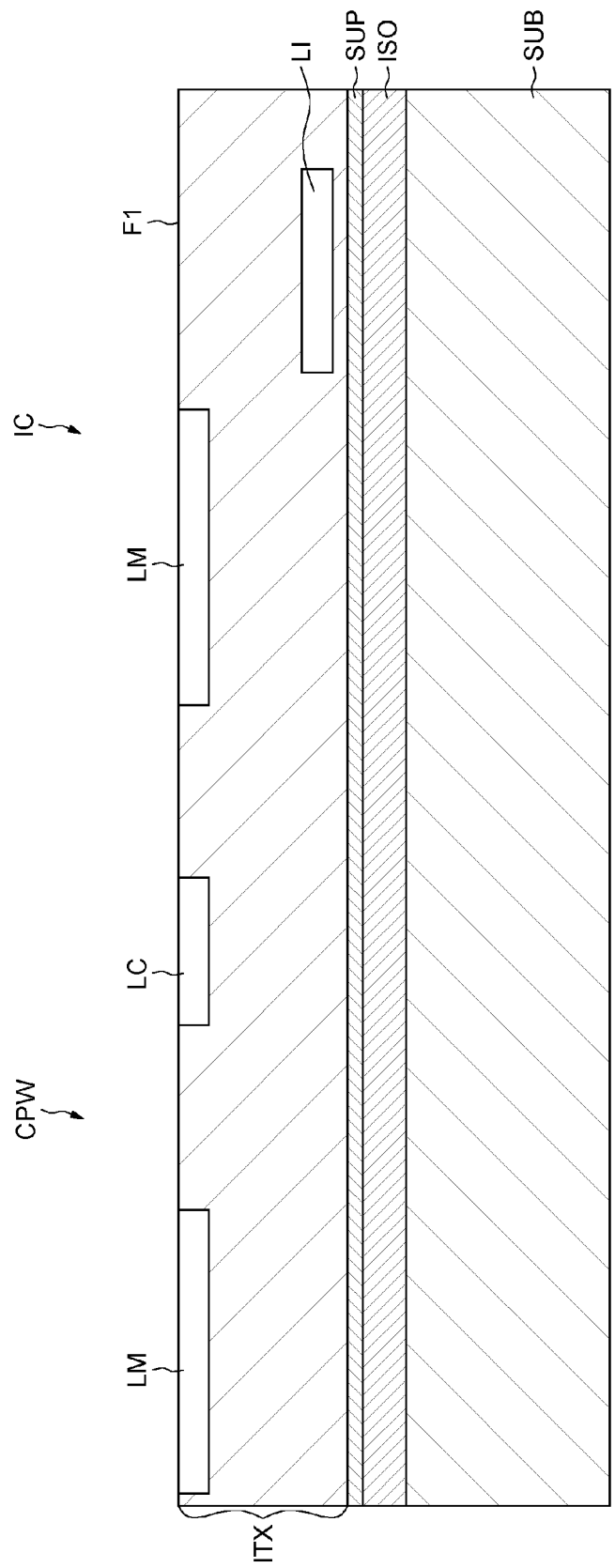
FIGS. 1 to 5 illustrate schematically methods of implementation and embodiment for producing an integrated circuit.

FIG. 1 shows an integrated circuit IC, produced on an SOI (silicon-on-insulator) wafer, comprising a buried oxide ISO, a (preferably high-resistivity) silicon substrate SUB, a top silicon layer SUP and an interconnect part ITX located on the top silicon layer SUP (possibly also comprising STI-type isolating regions). The interconnect part ITX corresponds to the BEOL (back end of line) part, well known to those skilled in the art. The top silicon layer SUP may for example comprise components such as transistors, possibly separated by STI (shallow trench isolation) replacing the silicon of the top silicon layer SUP with $SiO_2$ (silicon dioxide).

Of course, the integrated circuit IC may be produced in a bulk silicon substrate not comprising the buried oxide layer ISO. This bulk substrate may also comprise shallow trench isolation neighboring its side supporting the interconnect part ITX.

The circuit IC comprises, in the interconnect part ITX, a coplanar waveguide CPW. This coplanar waveguide CPW comprises a conductive line LC, intended to allow a high-frequency signal to pass, and framed by two ground lines LM. The coplanar waveguide CPW may be produced, for example, in the highest metallization level of the interconnect part ITX.

The integrated circuit IC comprises, on another metallization level, for example the first metallization level of the interconnect part ITX, a metal line LI, for example a metal line allowing various components of the integrated circuit IC to be interconnected.

A high-frequency signal passing through the conductive line LC will be attenuated by losses due to the resistivity of the line, to its inductance, to capacitive coupling between the line and the substrate SUB, and finally to current flow under the buried oxide ISO in a conductive region created in the substrate SUB by charge trapped in the buried oxide ISO.

If the integrated circuit IC is produced in a bulk silicon substrate, the current flows at the interface between the interconnect part ITX and the substrate.

It is also possible to reduce conduction losses in the top silicon layer SUP by placing the waveguide CPW on shallow trench isolation.

The conductance of the substrate SUB is furthermore reduced by using a high-resistivity silicon substrate, typically having a resistivity higher than 1 k$\Omega$·cm, for example 3 k$\Omega$·cm.

Figure 2:
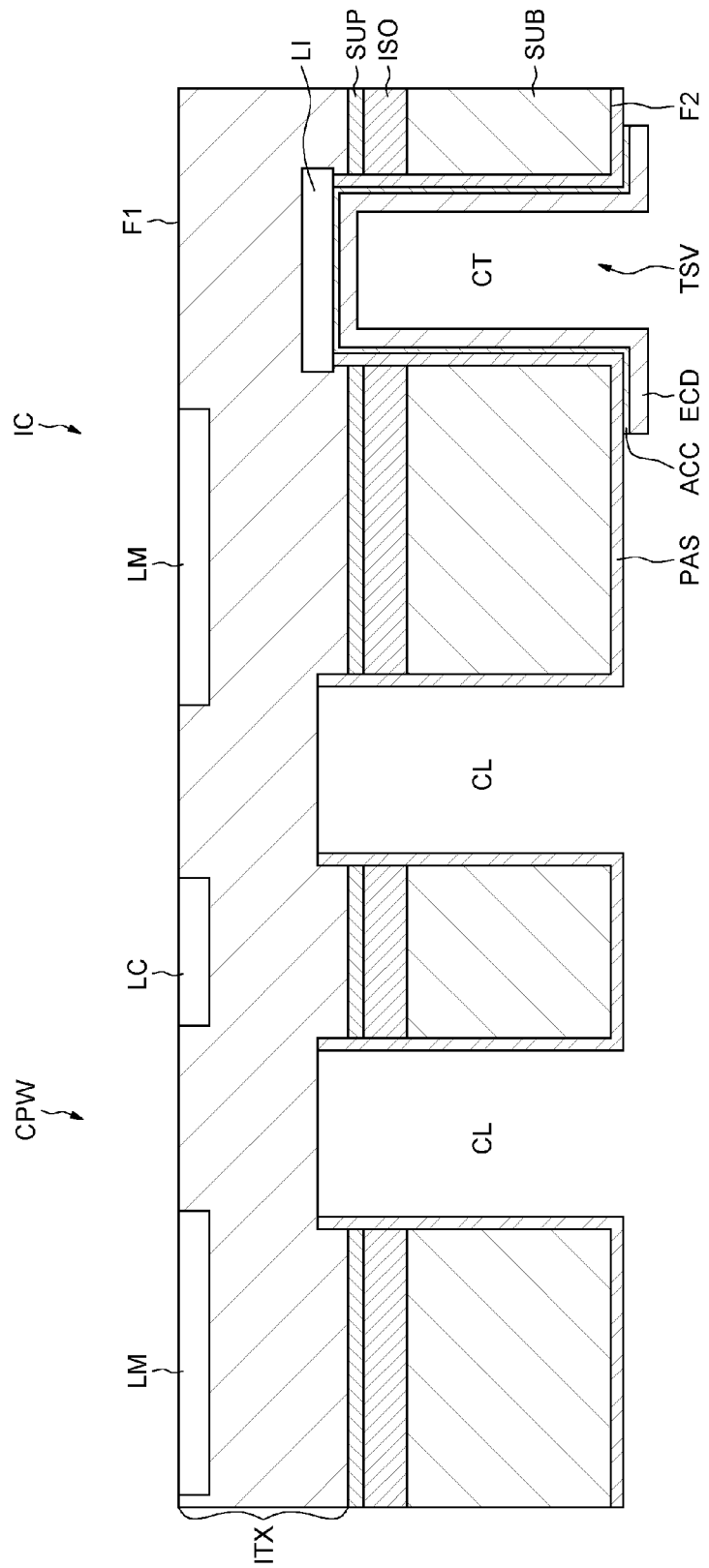

FIG. 2 shows the integrated circuit IC after two trenches and a cavity have been simultaneously formed in the backside F2 of the integrated circuit. These trenches and the cavity are formed simultaneously, for example by an etching operation conventionally used to form through-silicon vias, such as RIE (reactive ion etching), and have substantially the same depth.

Under the metal line LI, a first cavity CT has been produced so as to form a through-orifice for a through-silicon via TSV. The cavity CT is formed on the backside F2 of the integrated circuit and opens onto the metal line LI. In other words, the cavity CT passes through the substrate SUB, the insulating layer ISO, and the top silicon layer SUP, so as to open onto the line LI or at least into the interconnect part ITX.

The through-silicon via thus allows the integrated circuit IC to be connected to another integrated circuit within a three-dimensional stack, or else allows the integrated circuit IC to be connected to a printed circuit board.

Two trenches CL, placed substantially between the conductive line LC and the ground lines LM, have also been formed simultaneously. These trenches open onto the part ITX comprising the various metallization levels of the integrated circuit IC.

These trenches CL allow current flow under the buried oxide ISO to be limited, and are present over the entire length of the waveguide, thus limiting conduction losses in the substrate. The trenches CL have substantially the same depth as the cavity CT and especially pass through the substrate SUB, the insulating layer ISO and the top silicon layer SUP. The trenches CL may also pass through shallow trench isolation, comprising silicon dioxide, placed under the waveguide CPW in the top silicon layer SUP.

If the integrated circuit IC is produced in a bulk silicon substrate, the cavities and the trenches pass through the substrate and open, in an analogous way, into the part ITX. Thus conduction losses under the interconnect part are limited.

After the cavity CT and the trenches CL have been formed, various steps may be carried out on the backside F2 of the integrated circuit IC.

In particular, what is called a passivation layer PAS may be formed, comprising $SiO_2$ (silicon dioxide) or SiON (silicon oxynitride), on the backside of the integrated circuit IC and on the sidewalls of the trenches CL and cavity CT. Next, a copper tie layer ACC, also comprising a diffusion barrier, may be formed on the bottom of the cavity CT, on the sidewalls of the cavity CT, and at least partially on the backside of the integrated circuit IC covered by the passivation layer PAS (etched at the bottom of the cavity CT). The layer ACC may be formed by means of successive deposition steps and may comprise TaN (tantalum nitride), tantalum and copper.

In order to form an electrical connection with the line, an electrodeposition step is carried out by means of the tie layer ACC. Thus a copper layer ECD is obtained on the bottom of the cavity CT, on the sidewalls of the cavity CT and partially on the backside F2 of the integrated circuit IC. Thus, an electrical contact may be produced on the backside of the integrated circuit IC so as to form the through-silicon via TSV.

Furthermore, the tie layer ACC may be removed from the bottom of the trenches CL. The tie layer ACC is deposited on side F2, and in all the cavities formed on this side. Since this layer is conductive, it is liable to induce losses under the waveguides and may be removed.

Figure 3:
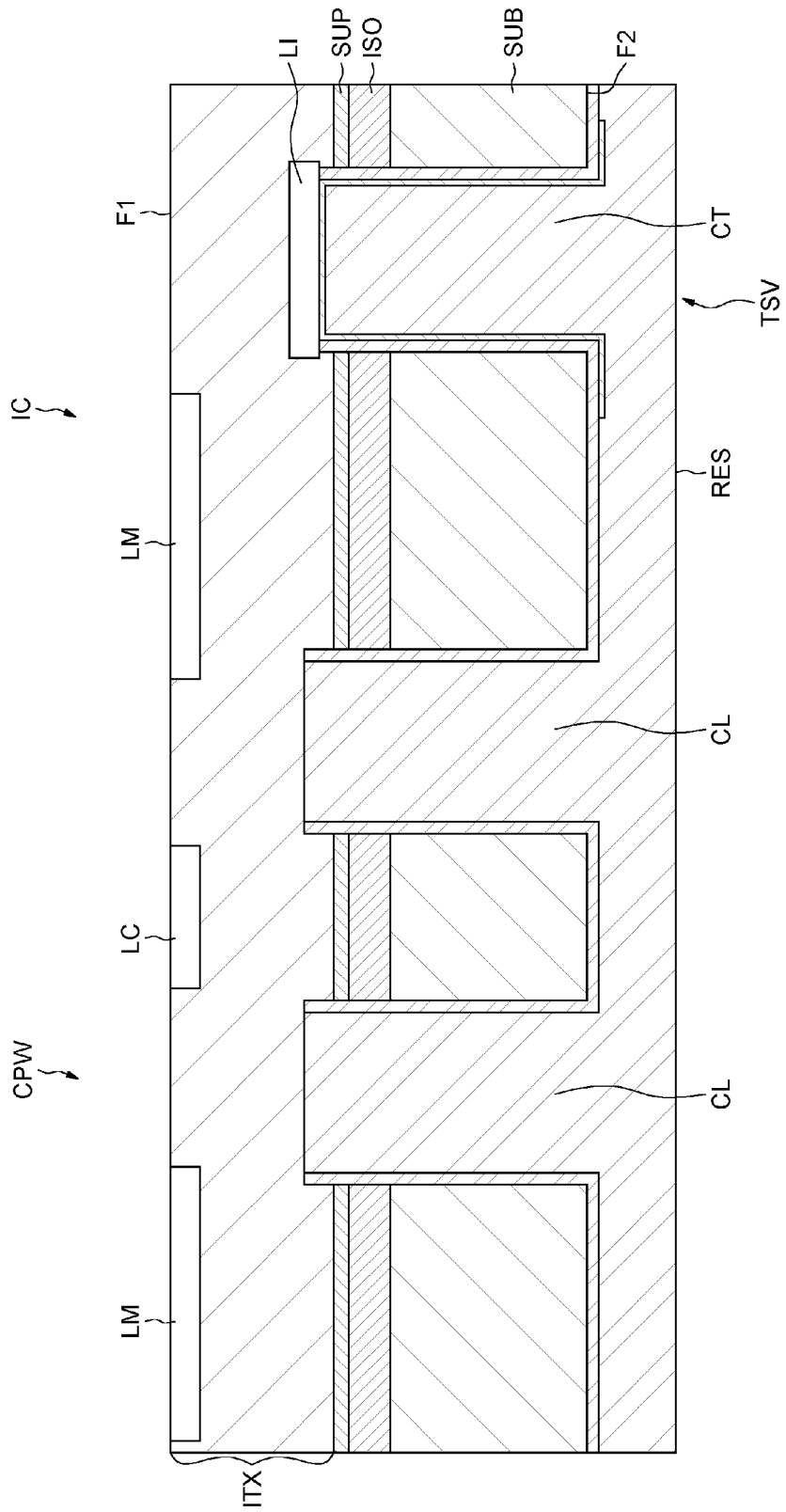

Reference is now made to FIG. 3. All the trenches and cavities formed on the backside of the integrated circuit IC are then filled with a polymer RES, a photoresist for example. The polymer RES also covers the backside F2 of the integrated circuit IC.

A cavity may also be formed within the polymer RES in order to form a contact pad on the copper layer ECD.

Filling of the trenches CL also increases their electrical permittivity. Thus, the capacitance of the parasitic capacitors formed between the various conductive lines of the integrated circuit IC and the substrate SUB is increased.

Figure 4:
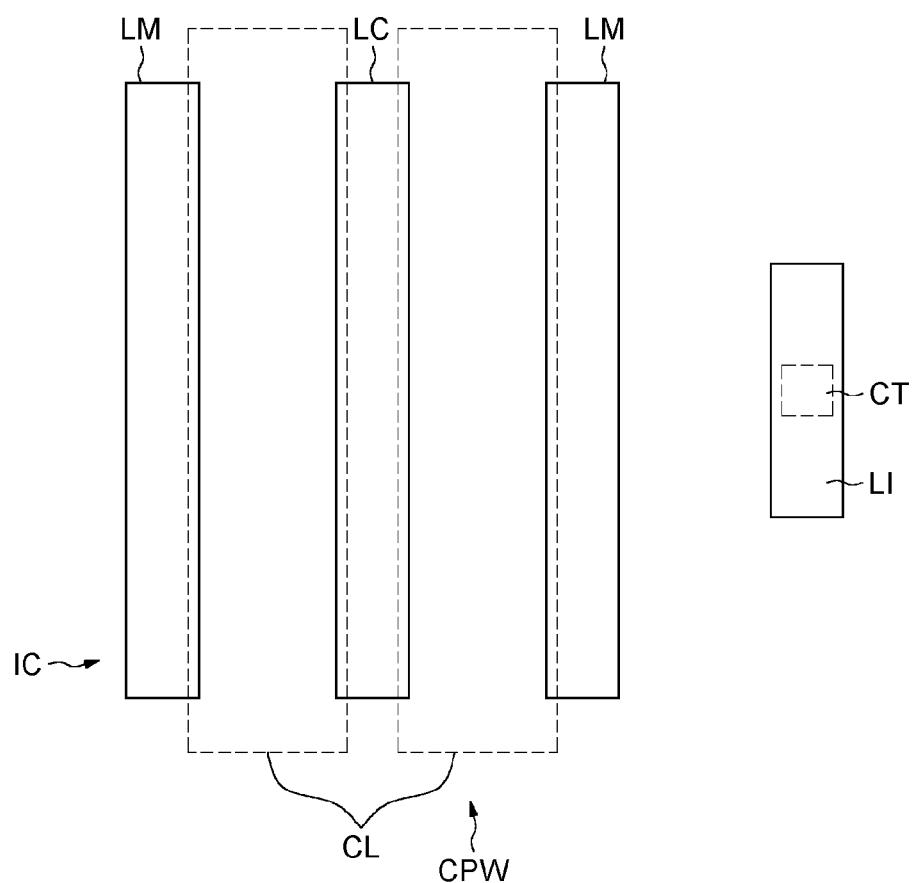

FIG. 4 shows a top view of a coplanar waveguide CPW analogous to that in FIG. 2.

The conductive line LC is placed between the two ground lines LM, and the two trenches CL are placed between these lines. These trenches are substantially longer than the metal lines, thereby better limiting losses.

FIG. 4 also shows the metal line LI placed over a through-silicon-via cavity CT.

Figure 5:
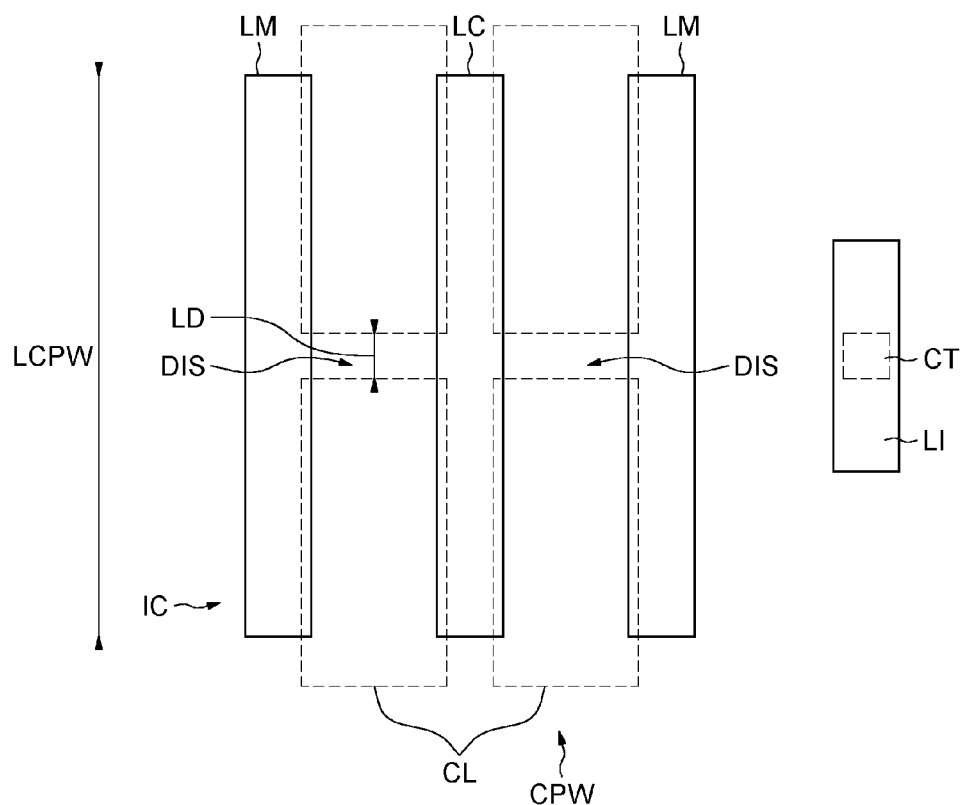

FIG. 5 shows a variant of the invention in which the trenches CL comprise two discontinuities DIS. The portions DIS are portions in which the silicon substrate SUB has not been etched, so as to increase the stiffness of the integrated circuit IC.

The length LD of the discontinuities is negligible relative to the length LCPW. By way of example, the length LD may be about 20 microns for a waveguide length LCPW ranging from 500 microns up to several millimeters. The discontinuities then have no effect on the losses because they are too short. The discontinuities may be placed every 500 microns.

By way of example, a coplanar waveguide, placed on a high-resistivity silicon-on-insulator substrate comprising polymer-filled trenches under the waveguide, may have an impedance of 72 ohms and an attenuation of about 0.16 decibels per millimeter when passing a 60 gigahertz signal. The same waveguide placed on a low-resistivity silicon wafer will possibly have an impedance of about 55 ohms and an attenuation of about 2.25 decibels per millimeter when passing a 60 gigahertz signal. The impedance increase is especially due to the reduced capacitance, itself due to the decrease in the electrical permittivity in the substrate. This being so, despite the increased impedance, losses are limited by virtue of the trenches preventing current flow under the buried oxide.

The cross section of the conductive lines may also be changed so as not to reduce the impedance of the lines.

What is claimed is:

1. A method, comprising:
   producing at least one through-silicon via through a semiconductor support;
   producing at least one coplanar waveguide above the semiconductor support;
   wherein producing said at least one through-silicon via comprises producing at least one through-cavity through the semiconductor support; and
   after the at least one coplanar waveguide has been produced, forming a trench under the at least one coplanar waveguide and extending over at least an entire length of the at least one coplanar waveguide;
   wherein said at least one through-cavity and said trench are produced simultaneously and have substantially a same depth.

2. The method according to claim 1, wherein forming the trench under the at least one coplanar waveguide comprises forming a discontinuous trench extending over at least the entire length of the at least one coplanar waveguide.

3. The method according to claim 1, wherein the semiconductor support comprises a bulk silicon substrate.

4. The method according to claim 1, wherein the semiconductor support comprises a top layer comprising silicon regions and isolating regions, said top layer being supported by an insulating layer itself supported by a silicon substrate.

5. The method according to claim 4, wherein the silicon substrate is a high-resistivity silicon substrate.

6. The method according to claim 1, further comprising filling said at least one through-cavity and said trench with a polymer.

7. The method according to claim 1, wherein producing the at least one coplanar waveguide comprises producing an electrically conductive line on the semiconductor support, the electrically conductive line being placed between two ground lines.

8. The method according to claim 7, wherein forming the trench comprises forming a set of two trenches, wherein each trench of the set is positioned substantially between one of the ground lines and said electrically conductive line.

9. The method of claim 7, wherein forming the trench comprises forming a first trench and second trench in a back side of the semiconductor support, said first and second trenches extending along a length of the at least one coplanar waveguide, and said first and second trenches being located underneath separating regions of said semiconductor support which separate each ground line from the electrically conductive line.

10. The method of claim 9, wherein the first trench and second trench have substantially a same depth.

11. The method of claim 10, wherein said same depth is a depth sufficient to pass completely through the semiconductor support.

12. The method of claim 10, wherein said same depth is a depth sufficient to pass completely through the semiconductor support and at least partially into an interconnect region of a metallization layer overlying the semiconductor support.

13. The method of claim 10, wherein each of said first trench and second trench is a discontinuous trench.

14. The method of claim 10, further comprising filling each of said first and second trenches with a polymer.

15. The method of claim 1, wherein the semiconductor support comprises an SOI substrate with an overlying interconnect layer, and wherein producing said at least one coplanar waveguide comprises forming the at least one coplanar waveguide in an upper metallization layer of said overlying interconnect layer.

16. The method of claim 15, wherein said interconnect layer includes a further metallization layer, and wherein said at least one through-cavity has a depth that reaches and electrically contacts said further metallization layer.

17. The method of claim 15, wherein said trench has a depth that reaches into said overlying interconnect layer.

* * * * *